United States Patent [19]

Hayes et al.

[11] Patent Number: 5,053,711
[45] Date of Patent: Oct. 1, 1991

[54] NMR RADIO FREQUENCY COIL WITH IMPROVED AXIAL FIELD HOMOGENEITY

[75] Inventors: Cecil E. Hayes, Wauwatosa; Thomas K. Foo, Pewaukee, both of Wis.

[73] Assignee: General Electric Company, Milwaukee, Wis.

[21] Appl. No.: 467,474

[22] Filed: Jan. 19, 1990

[51] Int. Cl.⁵ ............................................. G01R 33/20
[52] U.S. Cl. ..................................................... 324/318
[58] Field of Search ............... 324/300, 307, 309, 311, 324/314, 318, 319, 320, 322; 333/219, 227

[56] References Cited

U.S. PATENT DOCUMENTS 4,439,733  3/1984  Hinshaw et al. ..................... 324/322
4,751,464  6/1988  Bridges .................................. 324/318

Primary Examiner—Michael J. Tokar
Attorney, Agent, or Firm—Quarles & Brady

[57] ABSTRACT

An RF coil assembly for an NMR instrument includes a cylindrical shield which encloses a set of equally spaced linear conductors that surround a central axis. A set of shielded conductors connect to the ends of the linear conductors to form loops. The effective lengths of the loops and the RF signal source which drives the loops are selected to improve the homogeneity of the RF field produced along the central axis.

10 Claims, 4 Drawing Sheets

NMR RADIO FREQUENCY COIL WITH IMPROVED AXIAL FIELD HOMOGENEITY

BACKGROUND OF THE INVENTION

This invention relates to nuclear magnetic resonance (NMR) apparatus. More specifically, this invention relates to radio frequency (RF) coils useful with such apparatus for transmitting and/or receiving RF signals.

In the past, the NMR phenomenon has been utilized by structural chemists to study, in vitro, the molecular structure of organic molecules. Typically, NMR spectrometers utilized for this purpose were designed to accommodate relatively small samples of the substance to be studied. More recently, however, NMR has been developed into an imaging modality utilized to obtain images of anatomical features of live human subjects, for example. Such images depicting parameters associated with nuclear spins (typically hydrogen protons associated with water in tissue) may be of medical diagnostic value in determining the state of health of tissue in the region examined. NMR techniques have also been extended to in vivo spectroscopy of such elements as phosphorus and carbon, for example, providing researchers with the tools, for the first time, to study chemical processes in a living organism. The use of NMR to produce images and spectroscopic studies of the human body has necessitated the use of specifically designed system components, such as the magnet, gradient and RF coils.

By way of background, the nuclear magnetic resonance phenomenon occurs in atomic nuclei having an odd number of protons or neutrons. Due to the spin of the protons and neutrons, each such nucleus exhibits a magnetic moment, such that, when a sample composed of such nuclei is placed in a static, homogeneous magnetic field, $B_o$, a greater number of nuclear magnetic moments align with the field to produce a net macroscopic magnetization M in the direction of the field. Under the influence of the magnetic field $B_o$, the aligned magnetic moments precess about the axis of the field at a frequency which is dependent on the strength of the applied magnetic field and on the characteristics of the nuclei. The angular precession frequency, $\omega$, also referred to as the Larmor frequency, is given by the Larmor equation $\omega = \gamma B$ in which $\gamma$ is the gyromagnetic ratio (which is constant for each NMR isotope) and wherein B is the magnetic field ($B_o$ plus other fields) acting upon the nuclear spins. It will be thus apparent that the resonant frequency is dependent on the strength of the magnetic field in which the sample is positioned.

The orientation of magnetization M, normally directed along the magnetic field $B_o$, may be perturbed by the application of magnetic fields oscillation at or near the Larmor frequency. Typically, such magnetic fields designated $B_1$ are applied orthogonal to the direction of the $B_o$ field by means of RF pulses through a coil connected to a radio-frequency-transmitting apparatus. Under the influence of RF excitation, magnetization M rotates about the direction of the $B_1$ field. In NMR studies, it is typically desired to apply RF pulses of sufficient magnitude and duration to rotate magnetization M into a plane perpendicular to the direction of the $B_o$ field. This plane is commonly referred to as the transverse plane. Upon cessation of the RF excitation, the nuclear moments rotated into the transverse plane precess around the direction of the static field. The vector sum of the spins forms a precessing bulk magnetization which can be sensed by an RF coil. The signals sensed by the RF coil, termed NMR signals, are characteristic of the magnetic field and of the particular chemical environment in which the nuclei are situated. In NMR imaging applications, the NMR signals are observed in the presence of magnetic-field gradients which are utilized to encode spatial information into the signals. This information is later used to reconstruct images of the object studied in a manner well-known to those skilled in the art.

In performing whole-body NMR studies, it has been found advantageous to increase the strength of the homogeneous magnetic field $B_o$. This is desirable in the case of proton imaging to improve the signal-to-noise ratio of the NMR signals. In the case of spectroscopy, however, this is a necessity, since some of the chemical species studied (e.g., phosphorus and carbon) are relatively scarce in the body, so that a high magnetic field is necessary in order to detect usable signals. As is evident from the Larmor equation, the increase in magnetic field B is accompanied by a corresponding increase in frequency and, hence, in the required resonant frequency of the transmitter and receiver coils. This complicates the design of RF coils which are large enough to accommodate the human body. One source of difficulty is that the RF field generated by the coil must be homogeneous over the body region to be studied to produce more uniform measurements and images. The production of uniform RF magnetic fields over large volumes becomes increasingly difficult at high frequencies owing to unwanted effects of stray capacitances between different parts of RF coils and between RF coils and surrounding objects or the NMR sample, itself, which limit the highest frequency at which the coil can be made to resonate.

Rf coils which produce substantially homogeneous fields at high frequencies throughout large volumes have been designed. Such coils are disclosed, for example, in U.S. Pat. No. 4,680,548 for use in whole body imaging of hydrogen nuclei at 1.5 Tesla, and U.S. Pat. No. 4,799,016 for use as a local coil in imaging both hydrogen and phosphorous nuclei at 1.5 Tesla. While such coils are capable of producing a homogeneous RF field within their central region of interest when no subject is present, they do not produce a homogeneous RF field when a typical subject is located in the region of interest.

In whole body RF coils such as that described in the above-cited U.S. Pat. No. 4,680,548, a set of linear conductors are disposed along and around a central z-axis and are joined at their opposing ends by a pair of circular conductors. This "birdcage" structure produces an RF field which is transverse to the z-axis and is relatively uniform, or homogeneous, in amplitude throughout the cylindrical region defined by its conductors. In copending U.S. application Ser. No. 07/467,475 which was filed on even date with this application and is entitled "NMR Radio Frequency Coil With Dielectric Loading For Improved Field Homogeneity," a technique for improving the homogeneity of the RF field strength in such a coil structure is described. To improve the homogeneity in the radial direction in a region of interest at the center of the coil, this technique employs a dielectric material having a high relative permittivity ($\epsilon_r$) to reduce the propagation constant along the direction of the z-axis ($k_z$). While this technique lowers the radial propagation constant ($k_p$) of the coil and smooths out variations in RF field strength in the radial direction, this technique exacerbates variations in the RF field strength along the z-axis. This is illustrated in FIG. 3 where FIG. 3A shows the RF field strength variations along the z-axis of the coil with no dielectric material used ($\epsilon_r = 1$), and FIG. 3B shows the Rf field strength when a dielectric material having a relative permittivity $\epsilon_r = 20$ is used. It is readily apparent that the central region where substantially uniform field strength is produced is shortened considerably along the z-axis when the dielectric material is used. When axial images are produced, this shortened region of uniform RF field strength along the z-axis is not of great concern. However, when sagittal or coronal views are produced, the variations in RF field strength along the z-axis will appear as shading in the image.

SUMMARY OF THE INVENTION

The present invention relates to an RF coil assembly for an NMR instrument in which variation in the RF field strength along the z-axis are reduced by preventing standing waves from occurring. More particularly, the coil assembly includes a set of linear conductors, disposed along and around a central axis to define a cylindrical region of interest, a cylindrical shield disposed around the set of linear conductors and substantially concentric about the central axis, shielded return conductors connected to the ends of the linear conductors to form a closed loop which is an integer number of wavelengths in length, and drive means having two phase-displaced RF signal sources which are connected to said closed loop to produce an RF field in the region of interest which travels along the central axis.

A general object of the invention is to improve the RF field homogeneity along the central axis. By providing shielded return paths of the proper length and driving the coil assembly with a polyphase RF source, the standing wave which is produced in prior coil assemblies is destroyed. As a result, the wave is caused to move along the central axis and any variations in its field strength in that direction are averaged out over time. The nuclei which are excited by the RF field thus "see" a uniform RF field intensity over the relatively long data acquisition period typical in an MRI imaging system. Shading in coronal and sagittal views of the patient is thus substantially reduced.

A more specific object of the invention is to offset the increased inhomogeneities produced in the RF field strength along the central axis caused by the addition of a high permittivity dielectric material between the linear conductors and the shield. While such dielectric materials improve RF field homogeneity in the radial direction they produce standing waves along the central axis which vary considerably in amplitude. The present invention causes such waves to continuously move, or travel, in the direction of the central axis to average out the variations at any given point in the region of interest.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1A:
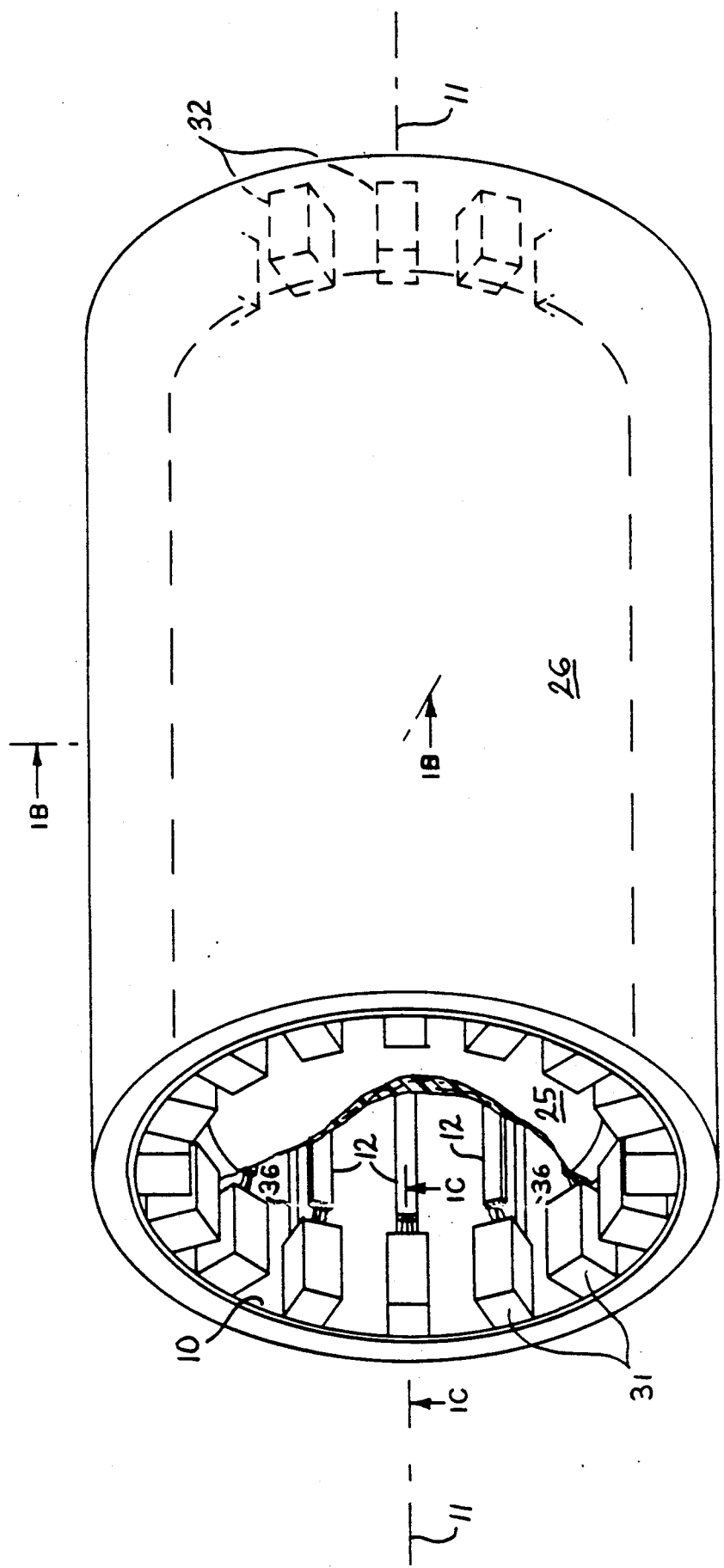
FIG. 1A is a perspective view of an RF coil assembly which employs the present invention.
Figure 1B:
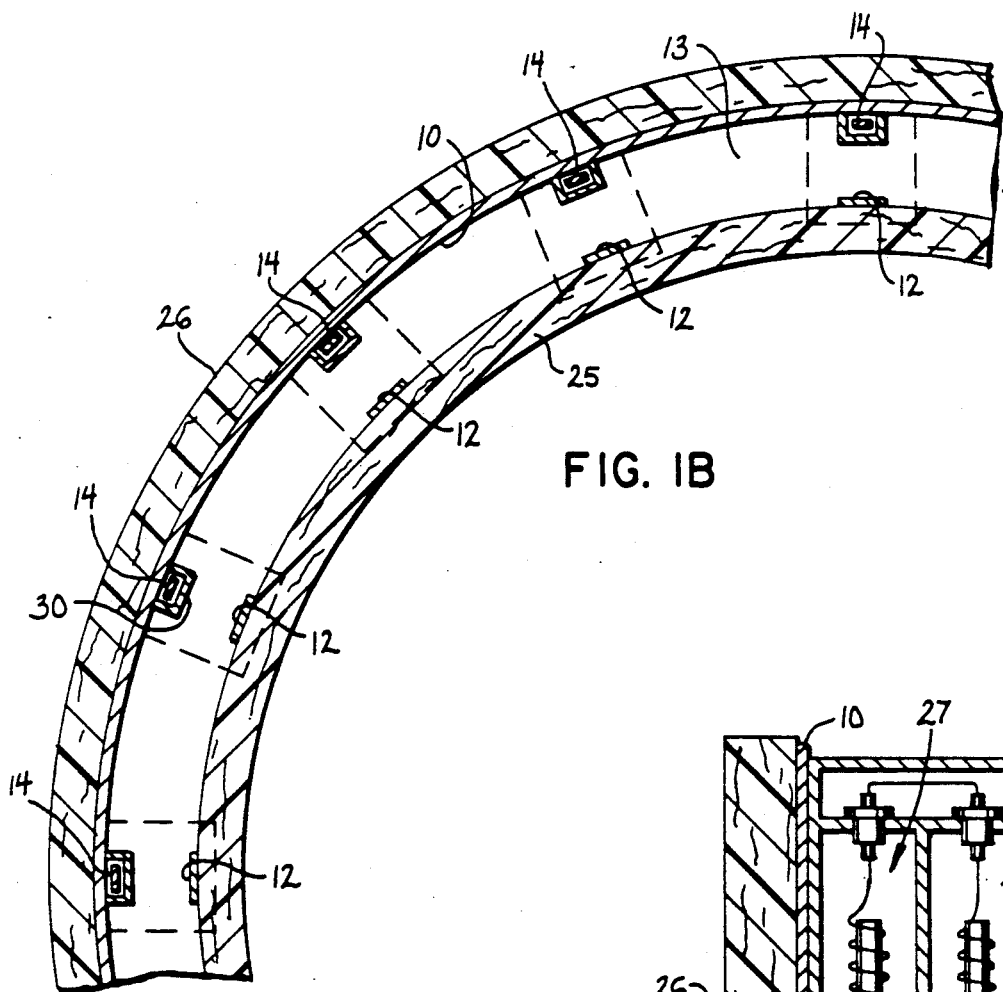
FIG. 1B is a partial view in cross-section taken along the plane 1B—1B shown in FIG. 1A.
Figure 1C:
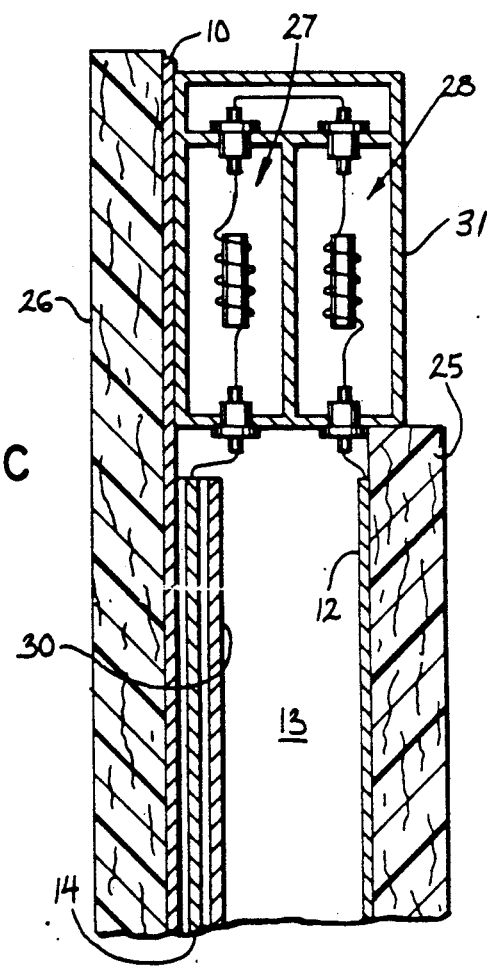
FIG. 1C is a partial view in cross-section taken along the plane 1C—1C shown in FIG. 1A.

Referring particularly to FIGS. 1A–1C, the RF coil assembly includes a circular cylindrical shield 10 which is disposed concentrically about a central axis 11 (z-axis). Located inside the shield 10 is a set of longitudinal conductors 12 which are disposed concentrically around the central axis 11 and which extend along the length of the shield 10. There are sixteen linear conductors 12 which take the form of copper strips that are equally spaced from each other around the circumference of a circular cylindrical fiberglass support form 25. The shield 10 is also formed as a sheet of copper that is supported on the inner surface of a circular cylindrical fiberglass outer form 26. The shield 10 and its support form 26 extend a short distance beyond the ends of the linear conductors 12 and parallel slots (not shown) are formed in the shield 10 as is well-known in the art to reduce audio frequency eddy currents therein due to imaging gradients. A dielectric material 13 is disposed in the annular space between the shield 10 and the set of linear conductors 12 and it has a relative permittivity in the range $20 \leq \epsilon_r 40$. Preferably, this dielectric material 13 is a water/isopropanol mixture contained in a thin-walled polyethylene sack (not shown), although solid materials may also be used.

Each linear conductor 12 is provided with a return path to form a closed loop. These closed loops are formed by a set of shielded conductors 14 that are mounted to the inner surface of the shield 10 and extend its entire length. In the preferred embodiment a shielded conductor 14 is associated with each of the sixteen linear conductors 12 and their ends are electrically connected together to form sixteen separate loops.

Figure 2:
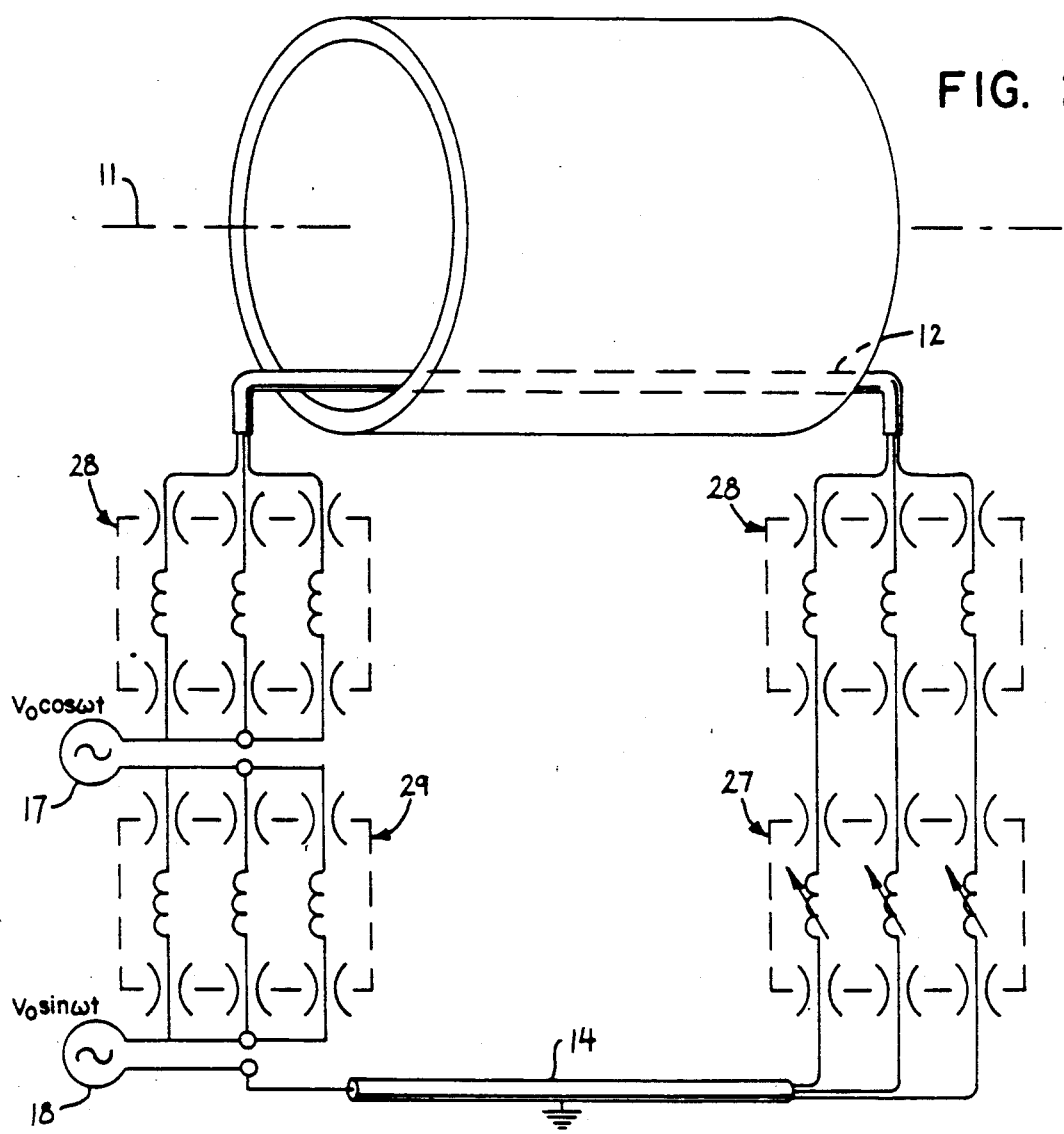
FIG. 2 is a schematic diagram of the RF coil assembly of FIG. 1.

Referring particularly to FIG. 2, the coil assembly is illustrated in part schematically. One of the sixteen closed loops is illustrated to demonstrate how the RF signal source is coupled to the coil assembly. First, it is a fundamental teaching of the present invention that each loop formed by a linear conductor 12 and shielded conductor 14 has a total effective length which is an integer number of wavelengths long. Accordingly, a lumped element, transmission line circuit 27 is connected in each loop, and its variable inductors can be adjusted to make the effective total length of each loop an integral number of wavelengths long. The impedance of the circuit 27 is matched to the impedance of the shielded conductor 14.

The conductor 12 and shielded conductor 14 are transmission lines which have different characteristic impedances. To minimize reflections at the interconnections of these transmissions lines, a lumped element, impedance matching circuit 28 is connected at each end of the linear conductor 12. These circuits 28 are lumped element, quarter wavelength impedance matching transformers whose characteristic impedance is the geometric mean of the characteristic impedances of the linear conductor 12 and the shielded conductor 14.

Referring still to FIG. 2, to produce a wave which travels along the direction of the central axis 11, the loops are driven by two RF signal sources 17 and 18. The signal sources 17 and 18 are physically inserted into the loop at positions which are spaced one quarter wavelength apart ($\lambda/4$). In the preferred embodiment this spacing is accomplished using a lumped element quarter wavelength transmission line circuit 29 having its characteristic impedance matched to that of the shielded conducter 14. In addition, the two signal sources have a phase difference of 90° (360°/4) with the result that the RF wave produced by each loop moves, or travels, along the loop. Within the region of interest inside the shield 10, the RF wave travels along the direction of the central axis at a uniform rate, which over a period of time, results in an average RF field amplitude which is homogeneous over a substantial portion of the region of interest.

Figure 4:
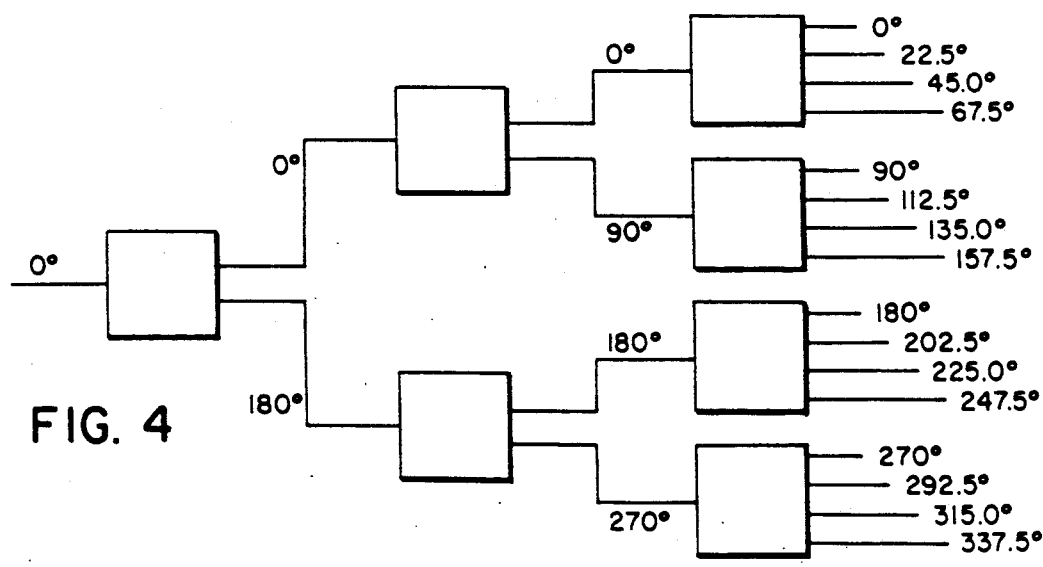
FIG. 4 is an electrical block diagram of a multiphase RF power source for the RF coil assembly of FIG. 1.
Figure 3A:
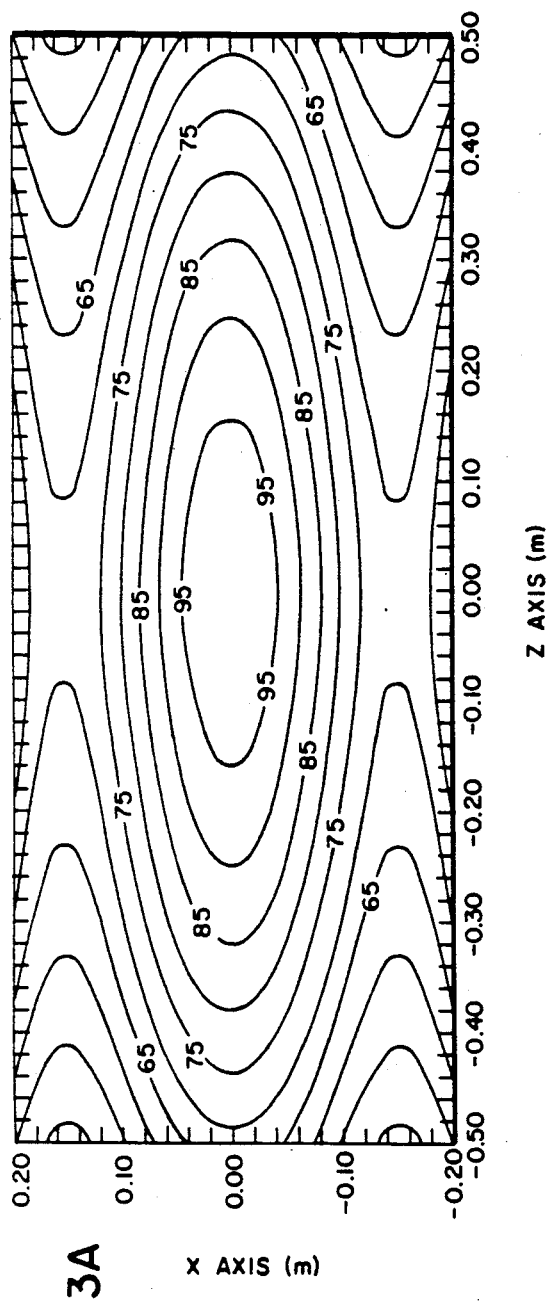
FIGS. 3A and 3B are contour maps of the RF field intensity variations along the central axis of the RF coil assembly when the present invention is not employed.
Figure 3B:
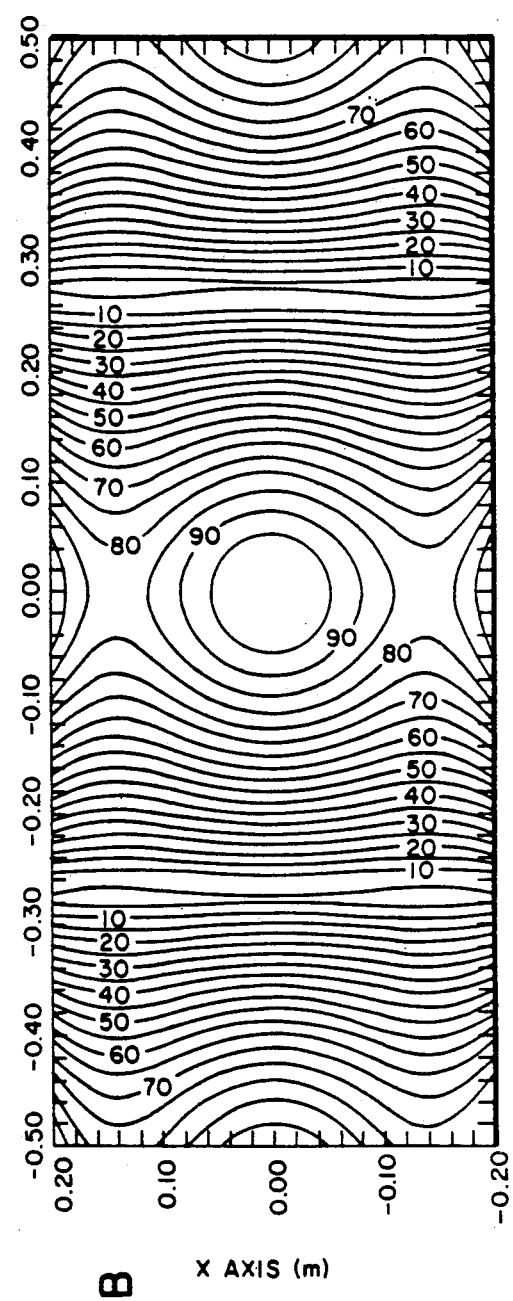

In the preferred embodiment a pair of RF signal sources are connected to each of the sixteen loops to not only produce the axially directed travelling wave, but to also rotate the RF field about the central axis 11 to reduce nonhomogeneities due to eddy currents in the subject under study. To produce this rotation, or circular polarization, each pair of RF signal sources is phase shifted by an amount determined by the circumferential position of their associated linear conductors 12. That is, the RF signal sources are represented as $$V_0 \cos(\omega t + \theta)$$

$$V_0 \sin(\omega t + \theta)$$

where $\theta$ is the circumferential location in degrees of the linear conductor 12 associated with the RF signal sources. In the preferred embodiment there are sixteen equally spaced linear conductors 12 and the phase of successive RF signal sources around the circumference are shifted by $\Delta\theta = 360/16 = 22.5°$. A phase splitter circuit for producing the necessary RF signals is illustrated in FIG. 4 for the sixteen $V_0 \cos(\omega t + \theta)$ signals. An identical circuit is provided for the sixteen $V_0 \sin(\omega t + \theta)$ signals, or in the alternative, a quadrature hybrid splitter can be used at each output of the phase splitter in FIG. 4 to provide both the cosine and sine signals.

Referring again to FIGS. 1A–1C, in the preferred embodiment of the invention the shielded conductors 14 are disposed within shields 30 that are formed on the inner surface of the cylindrical shield 10. The lumped circuits 27 and 28 are housed in shielded containers 31 located at one end of the conductors 12 and 14, and a corresponding set of shielded containers 32 house the lumped circuits 28 and 29 at the other end of the conductors 12 and 14.

There are a number of possible variations in the RF coil assembly. Instead of forming a separate loop for each of the linear conductors 12, two or more of the linear conductors 12 can be connected in series by the shielded conductors to form fewer closed loops. Indeed, all of the linear conductors 12 can be connected in series to form a single closed loop. Regardless of the configuration selected, the total effective length of any loop must be an integral number of wavelengths long in order to create a resonant circuit. In addition, the return conductors of the loops must be shielded from the region of interest.

While the two RF signal sources connected to each loop are 90° out of phase and are physically inserted in the loop at a spacing of one quarter wavelength, other phase differences and spacings are possible. It is only necessary that the phase difference and the spacing be chosen so that the signals produced by each phase of the RF signal reinforce each other for a travelling wave in the preferred direction and cancel the travelling wave in the opposite direction. In general, the two signal sources 17 and 18 can have a phase difference of either plus or minus 90° and can be connected to the loop at a spacing of any odd number of quarter wavelengths apart.

We claim:

1. An RF coil assembly for an NMR instrument which comprises:
   a cylindrical shield disposed concentrically about a central axis;
   a set of linear conductors which are disposed concentrically about the central axis and radially inward from the shield, each linear conductor being oriented in substantially the same direction as the central axis;
   a set of shielded conductors which are disposed around the circumference of the shield and which extend along the length of the shield and connect with the ends of the linear conductors to form one or more loops; and
   a polyphase RF signal source which has a frequency (f) and in which two phases of said polyphase RF signal source are connected to one of said loops;
   wherein each loop has a length which is an integral number of wavelengths ($\lambda$) long at the frequency (f).

2. The RF coil assembly as recited in claim 1 in which the phase difference between the two phases of said polyphase RF signal source and the locations of their connection to the one of said loops are selected to impart a movement of the RF field produced by said loop along the direction of the central axis.

3. An RF coil assembly for an NMR instrument which comprises:
   a cylindrical shield disposed concentrically about a central axis;
   a set of linear conductors which are disposed concentrically about the central axis and radially inward from the shield, each linear conductor being oriented in substantially the same direction as the central axis;
   a set of shielded conductors which are disposed around the circumference of the shield and which extend along the length of the shield, each shielded conductor being associated with a respective one of the linear conductors and being connected thereto to form a closed current conducting loop; and
   a polyphase RF signal source which has a frequency (f) and in which two phases of said polyphase RF signal source are connected to one of said loops;
   wherein each loop formed by a linear conductor and its shielded conductor has a length which is an integral number of wavelengths (λ) long at the frequency (f).

4. The RF coil assembly as recited in claim 3 in which the phase difference between the two phases of said polyphase RF signal source and the locations of their connection to the one of said loops are selected to impart movement of the RF field produced by said loop along the direction of the central axis.

5. The RF coil assembly as stated in claim 4 in which two additional phases of said polyphase RF signal source are connected to another one of said loops, the phase difference of said two additional phases are selected to impart movement of the RF field produced by said another one of said loops along the direction of the central axis, and the phase difference between said two phases and said two additional phases rotates the RF field produced by said loops around the central axis.

6. The RF coil assembly as recited in claim 3 in which a dielectric material is disposed in an annular space located between the shield and the linear conductors, and the dielectric material has a relative permittivity greater than twenty.

7. The RF coil assembly as recited in claim 3 in which the linear conductors are equally spaced about the circumference of the shield.

8. The RF coil assembly as recited in claim 7 in which there are sixteen linear conductors and sixteen associated shielded conductors which form sixteen separate loops.

9. The RF coil assembly as recited in claim 8 in which each loop is connected to separate pairs of phases from the polyphase RF signal source.

10. The RF coil assembly as recited in claim 9 in which the successive separate pairs of phases from the polyphase RF signals differ in phase by 22.5 degrees.

* * * * *